US009035306B2

(12) United States Patent
Hoentschel et al.

(10) Patent No.: US 9,035,306 B2
(45) Date of Patent: May 19, 2015

(54) ADJUSTING CONFIGURATION OF A MULTIPLE GATE TRANSISTOR BY CONTROLLING INDIVIDUAL FINS

(71) Applicant: GLOBALFOUNDRIES Inc., Grand Cayman (KY)

(72) Inventors: Jan Hoentschel, Dresden (DE); Robert Mulfinger, Dresden (DE); Vassilios Papageorgiou, Austin, TX (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 98 days.

(21) Appl. No.: 13/869,162

(22) Filed: Apr. 24, 2013

(65) Prior Publication Data

US 2013/0306967 A1    Nov. 21, 2013

Related U.S. Application Data

(62) Division of application No. 12/648,400, filed on Dec. 29, 2009, now Pat. No. 8,450,124.

(30) Foreign Application Priority Data

Dec. 31, 2008    (DE) .................. 10 2008 063 429

(51) Int. Cl.
| | |
|---|---|
| H01L 23/58 | (2006.01) |
| H01L 21/84 | (2006.01) |
| H01L 27/12 | (2006.01) |
| H01L 29/66 | (2006.01) |
| H01L 29/78 | (2006.01) |

(52) U.S. Cl.
CPC .............. *H01L 23/58* (2013.01); *H01L 21/845* (2013.01); *H01L 27/1211* (2013.01); *H01L 29/66795* (2013.01); *H01L 29/785* (2013.01); *H01L 2924/0002* (2013.01)

(58) Field of Classification Search
CPC ... H01L 21/845; H01L 27/1211; H01L 23/58; H01L 29/66795; H01L 29/785; H01L 2924/0002
USPC ........................... 257/48; 438/17; 324/762.01
See application file for complete search history.

(56) References Cited

U.S. PATENT DOCUMENTS

| | | | |
|---|---|---|---|
| 7,170,801 B2 | 1/2007 | Lee et al. ..................... 365/200 |
| 2005/0152186 A1 | 7/2005 | Ishibashi et al. ......... 365/185.08 |
| 2007/0018239 A1 | 1/2007 | Chen et al. .................... 257/329 |
| 2007/0181942 A1 | 8/2007 | Knoblinger et al. .......... 257/336 |
| 2009/0209074 A1 | 8/2009 | Anderson et al. ............. 438/283 |

FOREIGN PATENT DOCUMENTS

| | | | | |
|---|---|---|---|---|
| EP | 1 471 576 A2 | 10/2004 | ............ H01L 27/088 |
| WO | WO 2007/049170 A1 | 5/2007 | .......... H01L 21/8234 |

OTHER PUBLICATIONS

Translation of Official Communication from German Patent Office for German Patent Application No. 10 2008 063 429.8 dated Aug. 18, 2009.

*Primary Examiner* — Shaun Campbell
(74) *Attorney, Agent, or Firm* — Amerson Law Firm, PLLC

(57) ABSTRACT

In a sophisticated semiconductor device, FINFET elements may be provided with individually accessible semiconductor fins which may be connected to a controllable interconnect structure for appropriately adjusting the transistor configuration, for instance with respect to current drive capability, replacing defective semiconductor fins and the like. Consequently, different transistor configurations may be obtained on the basis of a standard transistor cell architecture, which may result in increased production yield of highly complex manufacturing strategies in forming non-planar transistor devices.

15 Claims, 7 Drawing Sheets

ADJUSTING CONFIGURATION OF A MULTIPLE GATE TRANSISTOR BY CONTROLLING INDIVIDUAL FINS

CROSS-REFERENCE TO RELATED APPLICATION

This is a divisional of co-pending application Ser. No. 12/648,400, filed Dec. 29, 2009, which claims priority to German Patent Application No. 10 2008 063 429.8, filed Dec. 31, 2008.

BACKGROUND OF THE INVENTION

1. Field of the Invention

Generally, the present disclosure relates to the fabrication of highly sophisticated integrated circuits including transistor elements having a non-planar channel architecture.

2. Description of the Related Art

The fabrication of advanced integrated circuits, such as CPUs, storage devices, ASICs (application specific integrated circuits) and the like, requires the formation of a large number of circuit elements on a given chip area according to a specified circuit layout, wherein field effect transistors represent one important type of circuit elements that substantially determines performance of the integrated circuits. Generally, a plurality of process technologies are currently practiced, wherein, for many types of complex circuitry including field effect transistors, MOS technology is currently one of the most promising approaches due to the superior characteristics in view of operating speed and/or power consumption and/or cost efficiency. During the fabrication of complex integrated circuits using, for instance, MOS technology, millions of transistors, e.g., N-channel transistors and/or P-channel transistors, are formed on a substrate including a crystalline semiconductor layer. A field effect transistor, irrespective of whether an N-channel transistor or a P-channel transistor is considered, typically comprises so-called PN junctions that are formed by an interface of highly doped regions, referred to as drain and source regions, with a slightly doped or non-doped region, such as a channel region, disposed adjacent to the highly doped regions. In a field effect transistor, the conductivity of the channel region, i.e., the drive current capability of the conductive channel, is controlled by a gate electrode formed adjacent to the channel region and separated therefrom by a thin insulating layer. The conductivity of the channel region, upon formation of a conductive channel due to the application of an appropriate control voltage to the gate electrode, depends on the dopant concentration, the mobility of the charge carriers and, for a planar transistor architecture, on the distance between the source and drain regions, which is also referred to as channel length.

Presently, the vast majority of integrated circuits are formed on the basis of silicon due to its substantially unlimited availability, the well-understood characteristics of silicon and related materials and processes and the experience gathered during the past 50 years. Therefore, silicon will likely remain the material of choice for future circuit generations designed for mass products. One reason for the importance of silicon in fabricating semiconductor devices has been the superior characteristics of a silicon/silicon dioxide interface that allows reliable electrical insulation of different regions from each other. The silicon/silicon dioxide interface is stable at high temperatures and thus allows the performance of subsequent high temperature processes, as are required, for example, for anneal cycles to activate dopants and to cure crystal damage without sacrificing the electrical characteristics of the interface.

For the reasons pointed out above, silicon dioxide is preferably used as a base material for gate insulation layers in field effect transistors that separate the gate electrode, frequently comprised of polysilicon or other metal-containing materials, from the silicon channel region. In steadily improving device performance of field effect transistors, the length of the channel region has continuously been decreased to improve switching speed and drive current capability. Since the transistor performance is controlled, among other things, by the voltage supplied to the gate electrode to invert the surface of the channel region to a sufficiently high charge density for providing the desired drive current for a given supply voltage, a certain degree of capacitive coupling, provided by the capacitor formed by the gate electrode, the channel region and the silicon dioxide disposed therebetween, has to be maintained. It turns out that decreasing the channel length for a planar transistor configuration requires an increased capacitive coupling to avoid the so-called short channel behavior during transistor operation. The short channel behavior may lead to an increased leakage current and to a pronounced dependence of the threshold voltage on the channel length. Aggressively scaled planar transistor devices with a relatively low supply voltage and thus reduced threshold voltage may suffer from an exponential increase of the leakage current due to the required enhanced capacitive coupling of the gate electrode to the channel region. Thus, the thickness of the silicon dioxide layer has to be correspondingly decreased to provide the required capacitance between the gate and the channel region. For example, a channel length of approximately 0.08 μm may require a gate dielectric made of silicon dioxide as thin as approximately 1.2 nm. Although usage of high speed transistor elements having an extremely short channel may typically be restricted to high speed applications, whereas transistor elements with a longer channel may be used for less critical applications, such as storage transistor elements, the relatively high leakage current caused by direct tunneling of charge carriers through an ultra thin silicon dioxide gate insulation layer may reach values for an oxide thickness in the range or 1-2 nm that may no longer be compatible with requirements for performance driven circuits.

Therefore, replacing silicon dioxide as the material for gate insulation layers has been considered, particularly for extremely thin silicon dioxide gate layers. Possible alternative materials include materials that exhibit a significantly higher permittivity so that a physically greater thickness of a correspondingly formed gate insulation layer provides a capacitive coupling that would be obtained by an extremely thin silicon dioxide layer. It has, therefore, been suggested to replace silicon dioxide with high permittivity materials such as tantalum oxide ($Ta_2O_5$), with a k of approximately 25, strontium titanium oxide ($SrTiO_3$), having a k of approximately 150, hafnium oxide ($HfO_2$), HfSiO, zirconium oxide ($ZrO_2$) and the like.

Although significant advantages may be obtained with respect to performance and controllability of sophisticated planar transistor architectures on the basis of the above-specified strategies, in view of further device scaling, new transistor configurations have been proposed in which a "three-dimensional" architecture may be provided in an attempt to obtain a desired channel width while at the same time maintaining superior controllability of the current flow through the channel region. To this end, so-called FINFETs have been proposed in which a thin sliver or fin of silicon may be formed in a thin active layer of a silicon-on-insulator (SOI) substrate, wherein, at least on both sidewalls of the fin, and possibly on a top surface thereof, a gate dielectric material and a gate electrode material may be provided, thereby realizing a "double gate" or tri-gate" transistor, the channel region of which may be fully depleted. Typically, in sophisticated applications, the width of the silicon fins is on the order of 10-20 nm and the height thereof is on the order of 30-40 nm.

Thus, FINFET transistor architectures, which may also be referred to herein as multiple gate transistors, may provide advantages with respect to increasing the effective coupling of the gate electrode to the various channel regions without requiring a corresponding reduction in the thickness of the gate dielectric material. Moreover, by providing this non-planar transistor architecture, the effective channel width may also be increased so that, for given overall transistor dimensions, an enhanced current drive capability may be accomplished. For these reasons, great efforts have been made in order to provide enhanced transistor performance on the basis of non-planar transistor architectures, wherein, however, sophisticated manufacturing processes may conventionally be used, such as selective epitaxial growth techniques. With reference to FIGS. 1a-1g, a complex conventional process flow for forming a multiple gate transistor is described in more detail in order to more clearly demonstrate the basic configuration and the process techniques involved.

FIG. 1a schematically illustrates a perspective view of a transistor element 100, which may be referred to as FINFET transistors or multiple gate transistors. As illustrated, the transistor 100 comprises a substrate 101 above which is formed a base layer 102, such as a silicon layer and the like. Moreover, a plurality of fins 110 are formed above the layer 102 and may be comprised of any appropriate semiconductor material, such as silicon, silicon/germanium and the like. As will be explained later on in more detail, the fins 110 may be formed on the basis of an epitaxially grown semiconductor material that may be deposited on the base layer 102, while, in other cases, sophisticated process techniques may be applied in order to provide an SOI configuration wherein the base layer 102 may represent an insulating material, such as silicon dioxide and the like. Furthermore, a gate electrode structure 120 is formed above a central portion of the fins 110, wherein the gate electrode structure 120 may comprise an appropriate gate dielectric material, such as silicon dioxide, in combination with an appropriate electrode material, typically a poly-silicon material. Thus, each of the fins 110 in combination with the common gate electrode structure 120 may represent a single transistor cell of the device 100. In the example shown, the fins 110 may have formed thereon a cap layer 112 which may also extend laterally through the gate electrode structure 120, if a top surface of the fins 110 should not act as a channel region. On the other hand, respective sidewall surfaces 110A, 110B of the fins 110 may represent corresponding channel regions, the conductivity of which is controlled by the gate electrode 120. It should be appreciated that the fins 110 may exhibit an appropriate dopant concentration so as to define corresponding drain and source areas in each of the fins 110, while in other strategies corresponding drain and source regions may be formed in a later stage after connecting the end portions of the fins 110 by growing a further semiconductor material so as to fill the spacing between the individual fins 110.

FIG. 1b schematically illustrates a top view of the device 100 in an early manufacturing stage. As illustrated, the fins 110 may be formed with lateral dimensions in accordance with the overall design rules for the device 100.

FIG. 1c schematically illustrates a cross-sectional view of the device 100 of FIG. 1b along the line Ic. As illustrated, the fins 110 may extend down to the base layer 102 which may be accomplished on the basis of sophisticated lithography and etch techniques in which a semiconductor material, such as a silicon material and the like, may be etched. Typically, the semiconductor material of the fins 110 may be formed on the basis of complex epitaxial growth techniques. It should be appreciated that, depending on the overall process strategy, a cap material, such as the cap layer 112 (FIG. 1a), may be provided prior to patterning the fins 110 if the top surface of the fins 110 is not to be used as a channel region. Furthermore, prior to or after patterning the fins 110, a basic dopant profile may be established, for instance, with respect to defining the basic conductivity type of the fins and the like. This may be accomplished by implantation techniques and/or by incorporating a desired dopant species during the epitaxial growth process for forming the material for the fins 110. Next, the gate electrode structure 120 (FIG. 1a) is formed, for instance, by forming an appropriate gate dielectric material, such as silicon dioxide, which may be accomplished by sophisticated oxidation techniques and the like, followed by the deposition of the gate electrode material, such as polysilicon. After planarizing the electrode material, which may also comprise appropriate materials for forming a hard mask, adjusting the overall optical characteristics on the basis of an anti-reflective coating (ARC) material and the like, the electrode material may be patterned by using a resist mask obtained by lithography and performing an appropriate etch sequence, wherein a high degree of etch selectivity between the gate electrode material and the gate dielectric material may provide integrity of the end portions of the fins 110. For example, well-established yet complex process techniques are available for etching polysilicon material selectively to silicon dioxide.

FIG. 1d schematically illustrates a top view of the device 100 after the above-described process sequence and after the removal of any resist materials and other sacrificial materials used for patterning the gate electrode structure 120. As illustrated, the gate electrode structure 120 may have appropriate lateral dimensions so as to cover a central portion of the fins 110 and thereby defining corresponding channel lengths for each of the fins 110. Furthermore, the fins 110 may be covered by a gate dielectric material 121, such as silicon dioxide and the like, as previously explained.

FIG. 1e schematically illustrates a cross-sectional view along the line Ic of FIG. 1d. As illustrated, the gate electrode structure 120 may comprise a gate electrode material 122 that is formed between the spacing of adjacent fins 110, which are covered by the gate dielectric material 121. In the example shown, it may be assumed that each surface area, i.e., both sidewalls 110A, 110B and a top surface 110T, may act as actual channel regions, which are controlled by the surrounding gate electrode material 122 so that each of the surface areas 110A, 110B and 110T may be considered as being controlled by a dedicated gate electrode. After forming the gate electrode structure 120, drain and source areas may be formed, for instance, by ion implantation, which may include the deposition of a spacer material and patterning the same, if required, while, in other cases, a semiconductor material may be formed first in order to electrically connect end portions of the fins at both sides of the gate electrode structure 120 in order to provide respective drain and source areas. For this purpose, the end portions of the fins 110 not covered by the gate electrode structure 120 may be exposed by removing the gate dielectric material 121, which may be accomplished by well-established etch recipes, for instance on the basis of hydrofluoric acid and the like. Thereafter, the exposed surface portions of the fins 110 may be prepared for a subsequent selective epitaxial growth process, which may involve well-established cleaning processes and the like.

FIG. 1f schematically illustrates a top view of the device 100 after completing the selective epitaxial growth process, thereby forming a silicon material or a silicon/germanium material 131 at both sides of the gate electrode structure 120, thereby defining a drain area 130D and a source area 130S. Thus, as illustrated, the fins 110 may be connected with one end portion thereof to the drain area 130D and may be connected with another end portion thereof with the source area 130S.

FIG. 1g schematically illustrates a cross-sectional view through the drain area 130D along the line Ig, wherein it is illustrated that the epitaxially grown material 131 is in direct contact with the fins 110, thereby providing a continuous drain region, the conductivity thereof may appropriately be adapted by ion implantation and the like wherein corresponding spacer structures may be formed, as previously discussed, to provide a desired dopant concentration gradient in the vicinity of the gate electrode structure 120 (FIG. 1f).

After generating the desired dopant profile in the drain and source areas 130D, 130S, any further processes may be performed, such as anneal processes and the like, followed by the deposition of an appropriate interlayer dielectric material, for instance in the form of silicon dioxide in combination with an appropriate etch stop material, such as silicon nitride, which may then be patterned so as to obtain contact openings which are subsequently filled with an appropriate conductive material, such as tungsten and the like.

As a consequence, the above-described process sequence involves a plurality of complex manufacturing steps, which may have even more complex inter-dependencies that may be difficult to be assessed in advance so that a variation in one of these process steps may frequently result in non-predictable variations of one or many of the other interrelated process steps. For this reason, it is extremely difficult to provide a plurality of different "types" of FINFET elements in a given circuit layout, which, however, would be required by complex circuitry, which may include speed critical logic portions, memory areas analog circuitry and the like, each of which may require different "flavors" of transistor elements. For example, while, in performance-driven circuit portions, a moderately high current drive capability may be required for enhanced performance of the circuit under consideration, in other cases, a reduced drive current capability, even in combination with significantly different values thereof, may be necessary in order to obtain the required functional behavior. For instance, in static RAM cells, a reliable operation of the memory cell may require very different drive capabilities of pass transistors and pull-down transistors, which may therefore require significant differences in the overall transistor configuration. Consequently, although the FINFET element having the non-planar channel regions may provide a promising approach for further reducing device dimensions while nevertheless maintaining a high degree of channel controllability, a corresponding implementation of a reliable manufacturing process for complex circuitry based on a reasonable production yield may be extremely difficult.

The present disclosure is directed to various methods and devices that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure provides techniques and semiconductor devices in which transistor configuration of sophisticated FINFETs or generally transistors having a non-planar channel region may be adjusted after fabrication and/or during the operational lifetime of the semiconductor device, thereby providing the possibility of producing "standard" FINFET transistor cells by applying a well-defined manufacturing sequence, wherein a desired transistor configuration, for instance with respect to current drive capability, may be set after completing the manufacturing sequence. In other cases, a certain degree of redundancy may be implemented so that corresponding transistor cells, i.e., corresponding fins in combination with a portion of the gate electrode structure, may be identified as being outside of predefined parameter settings and may be functionally "replaced" by other semiconductor fins. To this end, some or all of the individual semiconductor fins may be contacted, at least at one end portion thereof, in an individual manner by providing corresponding contact elements, thereby enabling, in combination with a controllable interconnect structure, a controllable configuration of the number of fins that may actually take part in the transistor operation. Consequently, production yield of a corresponding manufacturing flow may be significantly increased, since a plurality of transistor cells of the same type may be appropriately configured so as to comply with the various requirements in complex circuit portions, for instance with respect to a different drive current capability. Moreover, in some illustrative aspects disclosed herein, the redundant functionality may also contribute to enhanced production yield, since defective transistors cells may be replaced by corresponding redundant semiconductor fins.

One illustrative method disclosed herein comprises providing a semiconductor device comprising a transistor having a non-planar channel region that is formed in a plurality of semiconductor fins. Each of the plurality of semiconductor fins comprises a first end portion, a second end portion and a channel portion positioned between the first and second end portions. The method further comprises adjusting an electrical configuration of the transistor by individually controlling connection of the first end portion of one or more of the plurality of semiconductor fins to a first node that represents one of a drain terminal and a source terminal of the transistor.

A further illustrative method disclosed herein relates to configuring a transistor of a semiconductor device. The method comprises determining a functional status of each of a plurality of semiconductor fins of the transistor. Moreover, a comparison of the functional statuses of the plurality of semiconductor fins with a target configuration of the transistor is performed. Finally, the method comprises individually connecting at least one of the plurality of semiconductor fins to at least one of a drain terminal and a source terminal of the transistor on the basis of the comparison.

One illustrative semiconductor device disclosed herein comprises a plurality of semiconductor fins, each of which comprises at least one end portion that is individually electrically accessible and a channel portion that connects to the end portion. Furthermore, a gate electrode structure is formed adjacent to the channel portion of each of the plurality of semiconductor fins so as to enable the controlling of channel regions provided in the channel portion. Furthermore, the semiconductor device comprises a controllable interconnect structure connecting to a first transistor terminal and to each of the individually electrically accessible end portions, wherein the controllable interconnect structure is configured to individually control connection of each of the end portions to the first transistor terminal. Additionally, a second transistor terminal is provided and is electrically connected to each of the channel portions.

BRIEF DESCRIPTION OF THE DRAWINGS

The disclosure may be understood by reference to the following description taken in conjunction with the accompanying drawings, in which like reference numerals identify like elements, and in which.

Figure 1A:
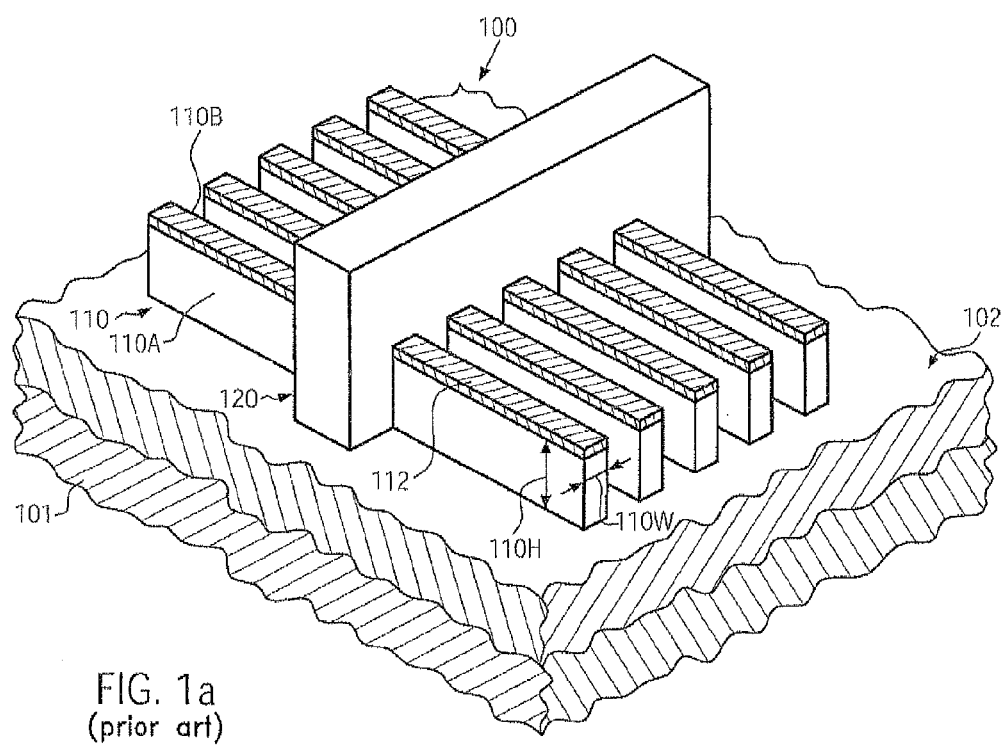
FIG. 1a schematically illustrates a perspective view of a conventional multiple gate transistor in an advanced manufacturing stage.
Figure 1B:
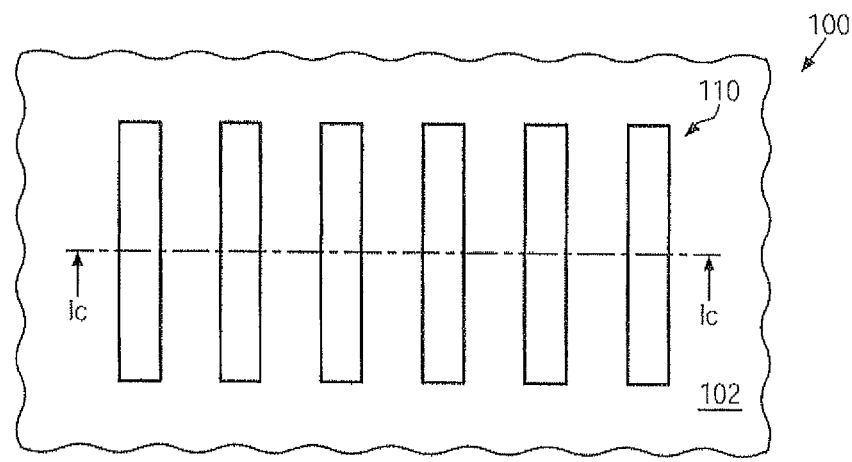
FIGS. 1b-1c schematically illustrate a top view and a cross-sectional view, respectively, of the conventional multiple gate transistor in an early manufacturing stage.
Figure 1C:
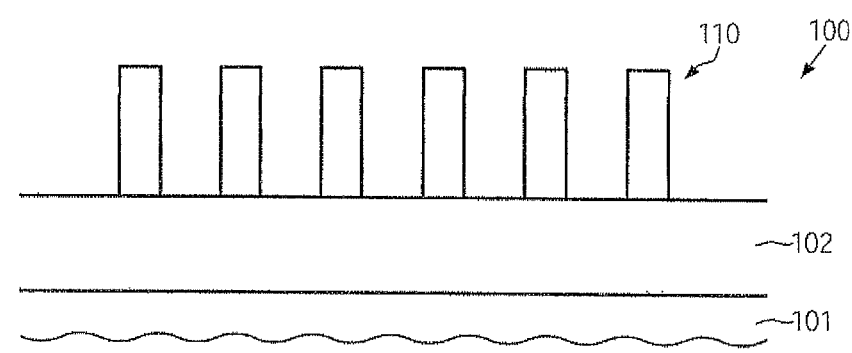
Figure 1D:
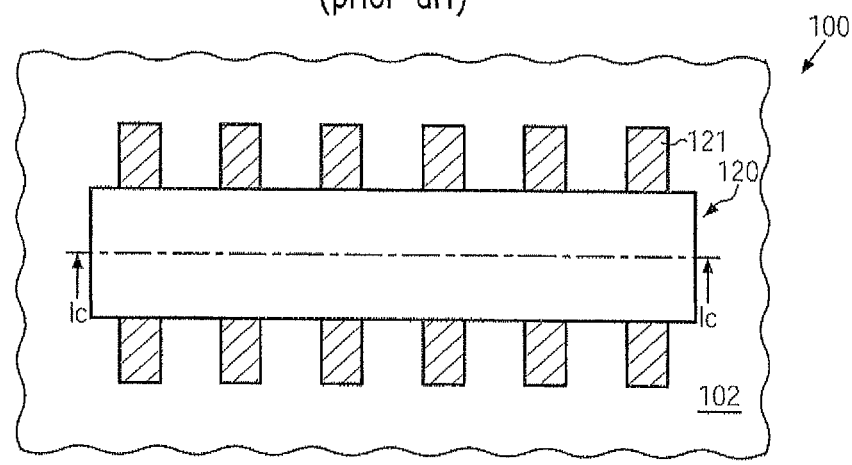
FIGS. 1d-1e schematically illustrate a top view and a cross-sectional view, respectively, of the conventional multiple gate transistor after forming a gate electrode structure.
Figure 1E:
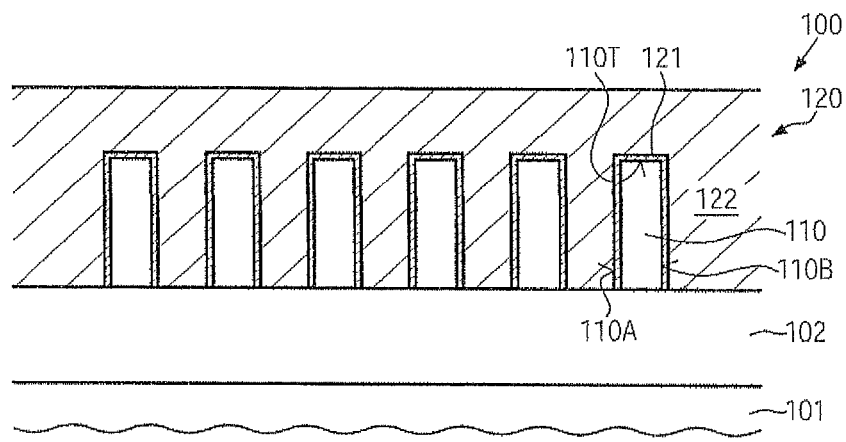
Figure 1F:
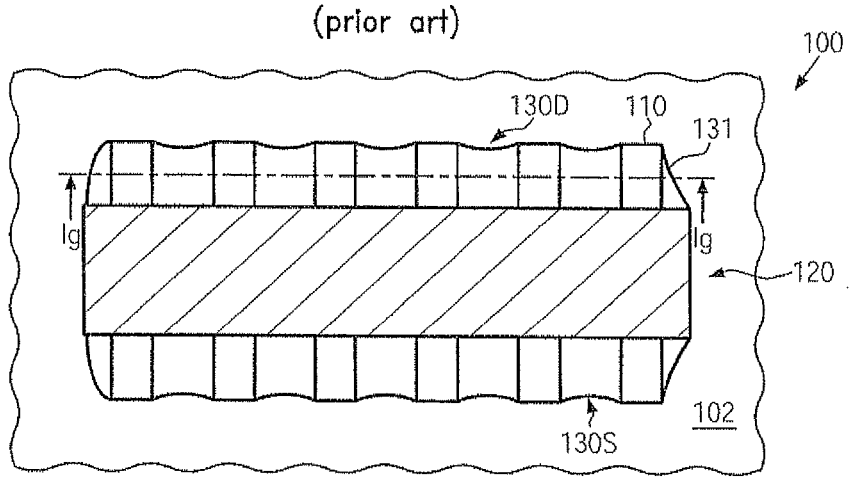
FIGS. 1f-1g schematically illustrate a top view and a cross-sectional view respectively, of the conventional multiple gate transistor after performing an epitaxial growth process for providing drain and source terminals of the FINFET transistor according to conventional strategies.
Figure 1G:
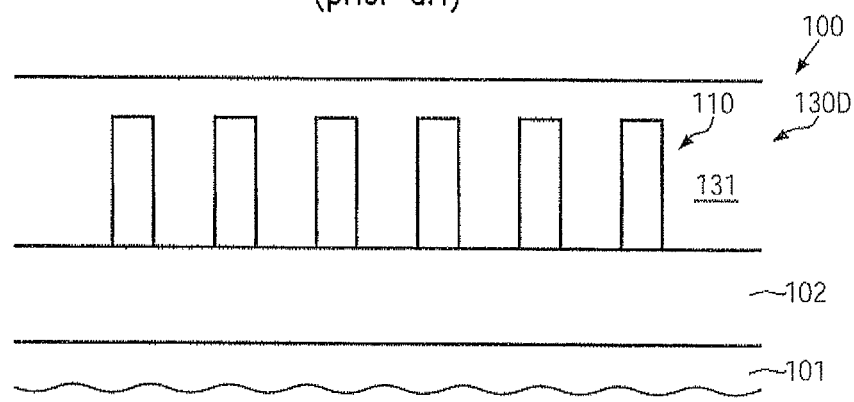

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Generally, the present disclosure provides semiconductor devices and methods of configuring sophisticated non-planar transistor elements contained therein by incorporating an enhanced interconnect regime for at least some sophisticated transistor elements, thereby enabling a flexible adjustment of the entire transistor configuration after completing the basic transistor structure. To this end, drain and/or source areas of individual semiconductor fins may be individually contacted by an appropriately-designed contact structure of the semiconductor device in order to connect each of the corresponding drain and/or source areas of the semiconductor fins with a controllable interconnect structure that may be configured so as to enable, at least once, to control the connection of the end portions to a common node, such as a drain terminal or a source terminal of the transistor. In some illustrative aspects, the controllable interconnect structure may comprise transistor elements, for instance, formed on the basis of less critical constraints compared to the sophisticated FINFET elements, thereby providing the possibility of repeatedly reconfiguring the sophisticated transistor elements. In other illustrative embodiments, the controllable interconnect structure may comprise conductors, such as resistive structures, and the like, which may be switched from a low impedance state into a high impedance state at least once so as to enable a disconnection of corresponding semiconductor fins from the common circuit node. For example, the controllable interconnect structure may be connected to external test equipment in order to appropriately set the transistor configuration, for instance, the current drive capability, in accordance with requirements for the specific transistor under consideration, while, in other cases, the actual functional status of the transistor under consideration may be determined and a corresponding control of the interconnect structure may be performed on the basis of the detected functional status. In still other illustrative embodiments, the interconnect structure may be controlled on the basis of device internal functional units, such as a decision block, which may decide how to configure a specific transistor on the basis of corresponding information that may be contained in a device internal storage element and the like. In other cases, an additional functional unit may be implemented in the semiconductor device to "measure" the functional status of transistor under consideration or the functional status of individual semiconductor fins, wherein the corresponding determined functional status may be compared with a target configuration. Based on the comparison, the interconnect structure may be controlled such that an appropriate number of individual transistor cells, i.e., semiconductor fins, may be used. In some illustrative embodiments disclosed herein, functional status of individual semiconductor fins may be determined in order to detect any "parts" of the overall transistor configuration which may violate specified operational limits so that a corresponding redundant portion of the transistor may be connected.

With reference to FIGS. 2a-2d, further illustrative embodiments will now be described in more detail, wherein reference may also be made to FIGS. 1a-1g.

Figure 2A:
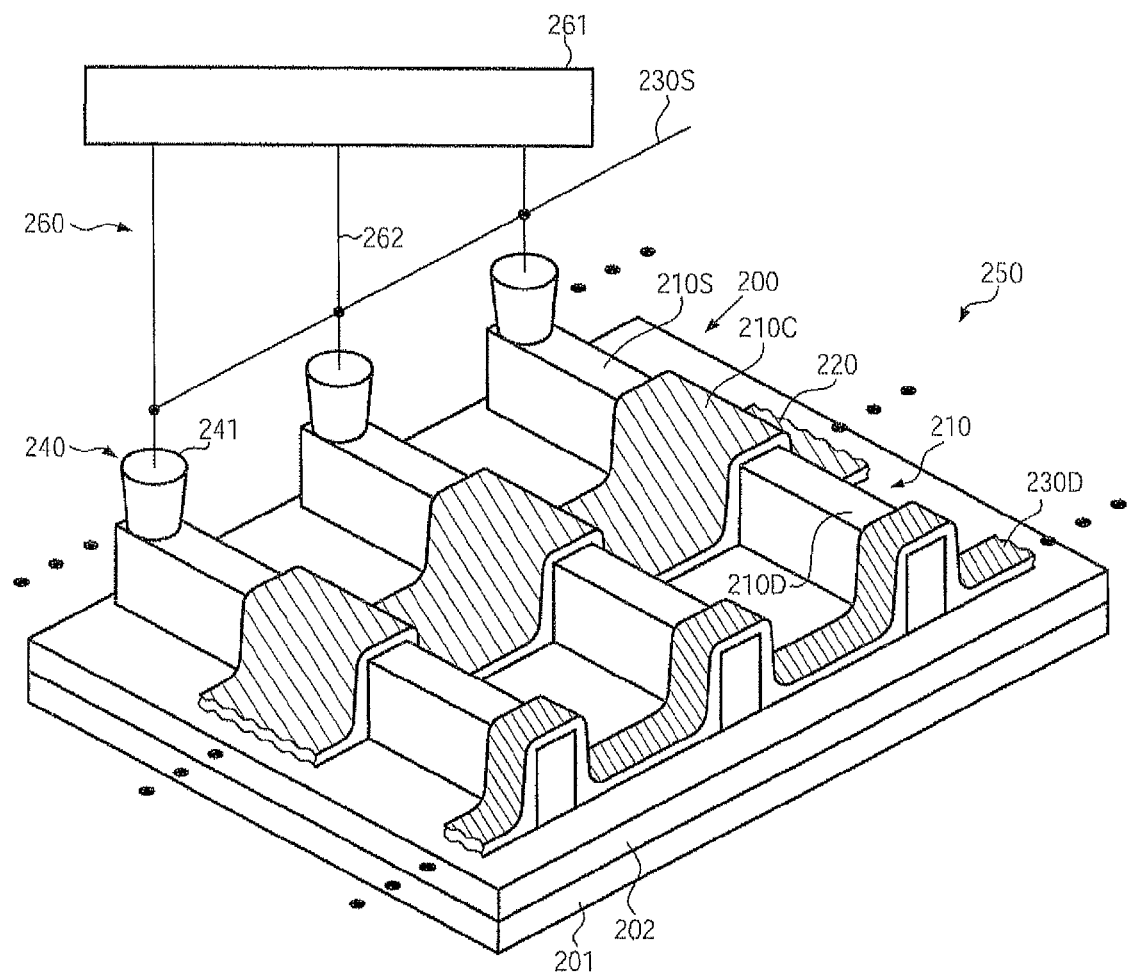
FIG. 2a schematically illustrates a perspective view of a semiconductor device comprising a plurality of semiconductor fins of a multiple gate transistor in an advanced manufacturing stage, in which at least one end portion of each of the semiconductor fins is individually electrically accessed by an associated contact element in order to electrically connect the end portions with a controllable interconnect structure, according to illustrative embodiments.

FIG. 2a schematically illustrates a perspective view of a semiconductor device 250, which may comprise a multiple gate transistor 200 comprising a plurality of semiconductor fins 210. The semiconductor device 250 may comprise a substrate 201, such as a silicon substrate, above which may be formed a base layer 202, such as a buried insulating layer and the like. The semiconductor fins 210 may be formed on the base layer 202 and may be comprised of any appropriate material, such as silicon, a silicon/germanium mixture and the like. Each of the semiconductor fins 210 may comprise a first end portion 210D, comprising an appropriate dopant concentration so as to act as a drain or source area, as previously explained. Similarly, each of the semiconductor fins 210 may comprise a second end portion 210S having an appropriate dopant concentration so as to act as a source or drain area. Furthermore, the first and second end portions 210S, 210D may laterally connect to a central or channel portion 210C, which may also be covered and in contact with a gate electrode structure 220. It should be appreciated that, with respect to the components described so far, i.e., the substrate 201, the base layer 202, the semiconductor fins 210 and the gate electrode structure 220, the same criteria may apply as previously explained with reference to the transistor 100 and the corresponding components. It is to appreciated that, in view of materials and dimensions of the semiconductor fins 210 and the gate electrode structure 220, similar strategies may be applied as previous explained, while it should be appreciated, however, that, depending on the technology standard under consideration, other materials and design dimensions may be used in order to comply with the overall process and device requirements. It should further be appreciated that only three individual semiconductor fins 210 are illustrated in FIG. 2a, however, typically, a larger number may be used, since the number of actually "active" fins 210 may be adjusted in a later stage, as will be described later on in more detail. For example, in some illustrative embodiments, the transistor 200 may be formed on the basis of an appropriate number of the semiconductor fins 210 so as to comply with the maximum required current drive capability to be provided by a sophisticated multiple gate transistor of the device 250. In still other illustrative embodiments, the number of semiconductor fins 210 may be selected such that a higher drive current capability may be applied, so that one or more redundant semiconductor fins 210 may be available, which may replace any non-functional semiconductor fins during operation of the semiconductor device 250.

In the embodiment shown, the end portions 210D of the semiconductor fins 210 may be electrically connected so as to provide a common transistor terminal 230D, which may present a source terminal or a drain terminal, depending on the operational status of the device 250. That is, in many applications, the corresponding drain/source terminals of sophisticated transistors may be used as drain or source regions at a given operational status of the transistor. The transistor terminal 230D may be provided in any appropriate form, for instance, in the form of a selectively epitaxially grown semiconductor material, as previously described with reference to the transistor 100, while, in other cases, any other contact regime may be used for electrically connecting the end portions 210D. For example, an appropriate contact structure (not shown) may be provided so as to form a metal-containing material, such as tungsten and the like, which may be in contact with each of the end portions 210D, thereby providing the desired electrical connection.

On the other hand, the end portions 210S may be provided as electrically individually accessible portions of the semiconductor fins 210 so as to connect to a contact structure 240, which may thus comprise a plurality of individual contact elements 241, each of which may connect to a respective one of the end portions 210S. The contact structure 240 may be provided in any appropriate configuration. For instance, a dielectric material, for instance silicon dioxide, silicon nitride or any other dielectric materials, which may even comprise low-k dielectric materials, may be provided (not shown) and may be appropriately patterned so as to form corresponding openings, which may subsequently be filled with an appropriate material, such as tungsten and the like. In some cases, the contact structure 240 may be formed so as to provide the transistor terminal 230D thereby, for instance, avoiding sophisticated epitaxial growth techniques for connecting the end portions 210D, as is, for instance, previously described with reference to the transistor 100. Consequently, by providing the individual contact elements 241, each of the end-portions 210S is individually electrically accessible such that the overall configuration of the transistor 200 may be adjusted by actually connecting selected ones of the semiconductor fins 210 so as to act as a second transistor terminal, such as a source or drain terminal.

In the embodiment illustrated in FIG. 2a, the contact structure 240 providing the individual electrical connection of the semiconductor fins 210, i.e., of the end portions 210S, may be connected to a controllable interconnect structure 260 comprising a plurality of "switches" 262 and a corresponding switch control section 261, which may be configured to controllably "actuate" switches 262, at least once. The switches 262 may connect, when in a closed state, a respective one of the end portions 210S with a common node or terminal 230S, which may thus represent the second transistor terminal of the transistor 200. Consequently, by appropriately controlling the switches 262, the number of semiconductor fins 210 may be set, which may actively contribute to the drive current capability of the transistor 200. It should be appreciated that the controllable interconnect structure 260 may be established partially within the device level, that is, within a semiconductor material, and also within the contact structure 240 and any metallization levels that may typically be provided above the contact structure 240 so as to provide the electrical connections of the circuit elements of the semiconductor device 250. For example, the switches 262 may be represented by transistor elements, however, of less critical configuration compared to the non-planar transistor 200, since these transistor elements may not require pronounced high current drive capability or switching speed, as long as the drive current of individual semiconductor fins 210 may be accommodated. For example, corresponding planar transistors for FINFET transistors may be used, wherein even transistors of a similar configuration as the transistor 200 may be used, however, without requiring a specific configurability, as long as the drive current capability of an individual semiconductor fin 210 may be "handled" by the corresponding transistor element, even if one or more defective corresponding fins of the switching transistors may be present. In other cases, the overall device dimensions may be selected such that less sophisticated transistor elements may be formed on the basis of manufacturing techniques that are designed for the critical transistors 200 without requiring any modifications, thereby also avoiding extremely complex manufacturing strategies for providing transistors of different characteristics. On the other hand, the transistor 200 and a plurality of identical transistor elements may be provided in critical device areas on the basis of a well-defined process strategy, while the actually required transistor configuration may be obtained on the basis of the controllable interconnect structure 260 in combination with the contact structure 240. In other illustrative embodiments, the switches 262 may comprise appropriately configured "resistive" structures, in which a transition from a low impedance state to a high impedance state or visa versa may be established at least once. For example, the switches 262 may initially be provided in a low impedance state so as to provide an initial configuration of the transistor 200 that corresponds to a maximum drive current capability. In a later stage, one or more of the switches 262 may be brought into a high impedance state, thereby appropriately reducing the drive current capability in accordance with the overall device requirements. For this purpose, the switches 262 may comprise a conductive portion, such as a metal silicide material and the like, which may be incorporated by applying an appropriate voltage to reduce the overall conductivity, for instance in using electromigration, dopant depletion and the like. Similar techniques may frequently be used for electronic fuses. For this purpose, the control section 261 may allow individual access to each of the switches 262 in order to provide a corresponding voltage and current for modifying the status of the corresponding switch 262. It should be appreciated that, in this case, only a portion of the semiconductor fins 210 have individually electrically accessible end portions 210S, while other end portions may be permanently connected to the terminal 230S so that a minimum drive current capability may permanently be provided in the transistor 200 while any value between the maximum drive current capability and the "hard-wired" minimum drive current capability may be selected by "de-activating" a desired number of the individually accessible semiconductor fins 210.

In some illustrative embodiments, the control section 261 may represent an appropriate interconnect structure that enables electrical access by external equipment in order to control the switches 262, for instance by providing the desired voltage and current pulses, providing appropriate control signals and the like. In other illustrative embodiments, the control section 261 may be connected to device internal functional blocks for appropriately providing a "pattern" for the switches 262 in order to obtain the desired configuration of the transistor 200, as will be explained later on in more detail. Furthermore, in other illustrative embodiments described later on, the interconnect structure 260 may also enable access to the semiconductor fins 210 so as to allow the determination of the functional status of the transistor 200. In other illustrative embodiments, the functional status of each of the individual semiconductor fins 210 may be determined, which may be understood as respective transistor cells of the transistor 200.

The semiconductor device 250 as illustrated in FIG. 2a may be formed on the basis of a manufacturing strategy as is, for instance, previously described with reference to the transistor 100 for providing the semiconductor fins 210 and the gate electrode structure 220. As previously explained, in some illustrative embodiments, the sophisticated transistor element 200 to be provided, at least in certain device areas of the semiconductor device 250, may be formed on the basis of a common manufacturing flow without requiring any variations in order to provide different transistor configurations. It should further be appreciated that, during the corresponding manufacturing sequence for providing the semiconductor fins 210 and the gate electrode structure 220, corresponding circuit elements for establishing the controllable interconnect structure 260 in the device level may also be fabricated. That is, corresponding transistor elements, resistive structures and the like may be formed together with the transistor element 200. Thereafter, the contact structure 240, possibly in combination with the interconnect regime for the terminal 230D, may be formed on the basis of an appropriate process strategy for providing the individual contact elements 241, which may be provided in accordance with appropriately modified strategies for forming the contact elements of conventional FIN-FET elements. Thereafter, a metallization system (not shown) may be provided on the basis of well-established manufacturing techniques, where corresponding metal lines and regions for completing the controllable interconnect structure 260 according to the required configuration thereof may also be provided.

At any appropriate manufacturing stage after completing the basic structure of the transistor 200, i.e., after providing the gate electrode structure 220, the semiconductor fins 210, the terminal 230D, the terminal 230S, the contact structure 240 and the controllable interconnect structure 260, the configuration of the transistor 200 and possibly of other transistors having the same configuration may be adjusted by generating corresponding patterns in the interconnect structure 260 such that the desired configuration may be achieved. For example, if the interconnect structure 260 may initially be manufactured so as to exhibit a specified pattern, for instance a respective initial current drive capability may be set, at least one of the switches 262 may be controlled so as to additionally connect to the terminal 230S a respective semiconductor fin 210 or disconnect a fin 210 from the terminal 230S. A corresponding configuration strategy may be set in advance, for instance, by identifying certain transistors that may require a reduced or increased drive current capability compared to the initially provided setting. For instance, respective electronic fuses may be used as the switches 262 and the initially provided maximum current drive capability may be appropriately reduced by "blowing" corresponding fuses of the interconnect structure 260, which may be accomplished by providing device internal control signals or which may be accomplished by using an appropriate test platform, which may be connected to the interconnect structure 260.

Figure 2B:
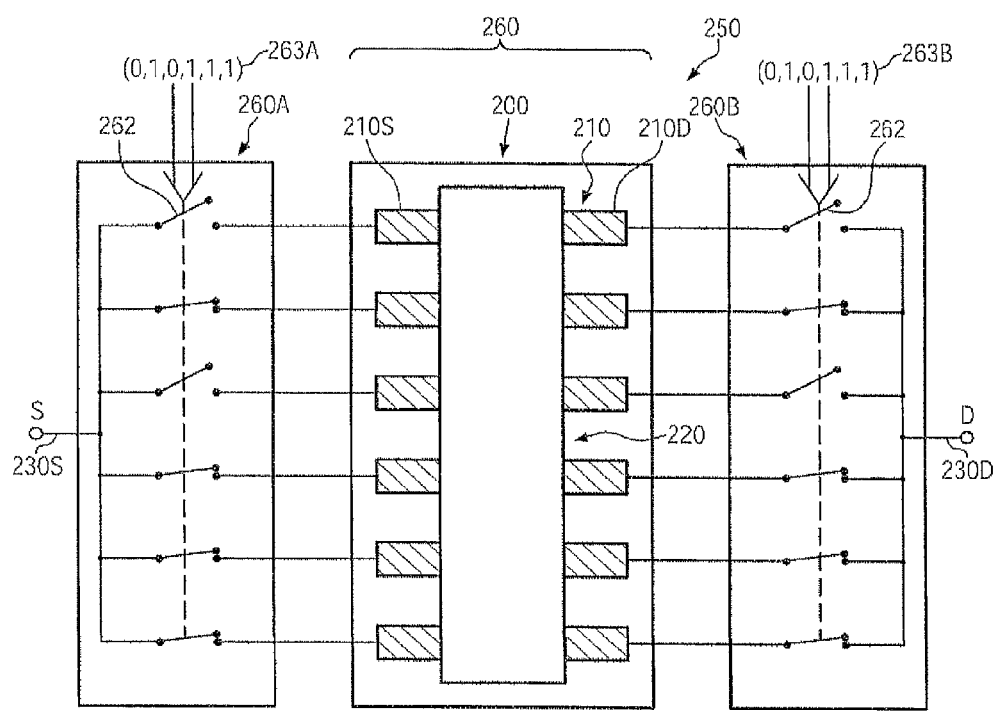
FIG. 2b schematically illustrates a top view of the semiconductor device in which a controllable interconnect structure may be connected to both end portions of a plurality of semiconductor fins to provide enhanced flexibility in adjusting the overall transistor configuration, according to further illustrative embodiments.

FIG. 2b schematically illustrates a top view of the semiconductor device 250 according to further illustrative embodiments. As illustrated, the controllable interconnect structure 260 may comprise a first interconnect structure 260A, which may connect at least some of the semiconductor fins 210, i.e., the end portions 210S, individually with the transistor terminal 230S. Furthermore, a second interconnect structure 260B may be provided and may individually connect the end portions 210D with the transistor terminal 230D. With respect to the first and second controllable interconnect structure 260A, 260B, the same criteria may apply as previously explained with reference to FIG. 2a when referring to the interconnect structure 260. Upon operating the interconnect structures 260A, 260B, an appropriate switch pattern, such as a bit pattern 263A, 263B, may be supplied in order to appropriately configure the transistor 200. For example, by applying the same pattern to the structures 260A, 260B, a corresponding semiconductor fin 210 may be completely isolated, which may be advantageous if the transistor configuration may be established on the basis of the functional status of the transistor 200. That is, if a defective transistor cell has been determined in the transistor 200, a complete isolation of the corresponding semiconductor fin 210 may provide enhanced reliability, since also in this case any defects with respect to the dielectric strength of a corresponding portion of the gate electrode structure 220 with respect to the semiconductor fin under consideration may be compensated for. In other words, if a portion of the gate dielectric material may suffer from a reduced dielectric strength or static gate leakage currents may be detected, the corresponding semiconductor fin 210 may be isolated without negatively affecting the overall behavior of the transistor 200. Hence, an even further increased degree of reliability may be accomplished, since a higher degree of defect coverage may be provided on the basis of the first and second interconnect structures 260A, 260B.

Figure 2C:
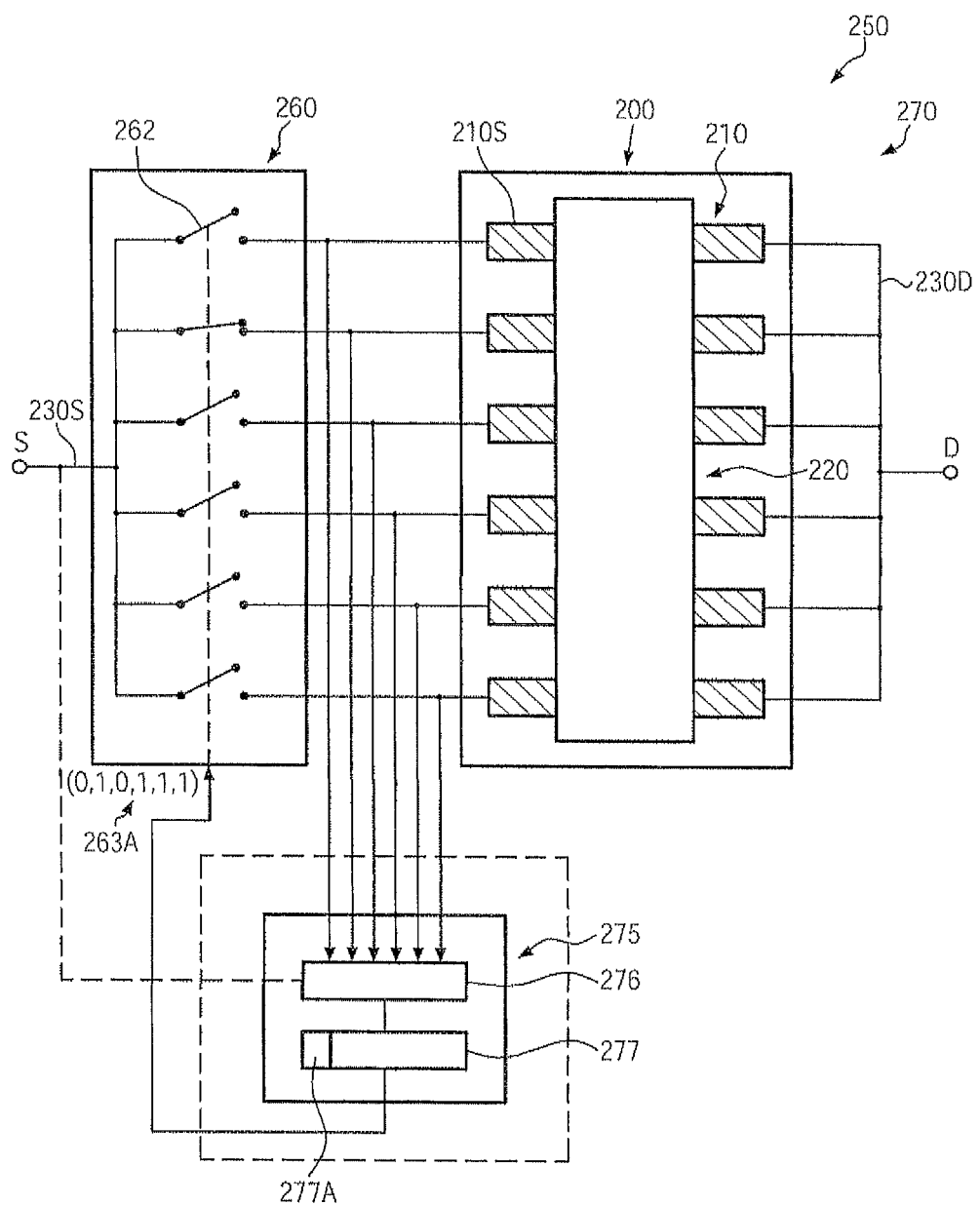
FIG. 2c schematically illustrates functional units which may be partially or entirely provided in the semiconductor device or which may be partially provided by an external test equipment in order to detect the functional status of the transistor and appropriately adjust the configuration thereof, according to still further illustrative embodiments.

FIG. 2c schematically illustrates a top view of an electronic system 270 comprising the semiconductor device 250 and a control unit 275 that is electrically connected to the controllable interconnect structure 260. In one illustrative embodiment, the electronic system 270 may comprise the control unit 275 in the form of functional units and blocks provided externally to the semiconductor device 250, wherein the controllable interconnect structure 260 may provide an appropriate contact regime so as to allow access by the external control unit 275. For this purpose, appropriate I/O (input/output) capabilities may be provided in a corresponding metallization system, as is also previously explained.

In other illustrative embodiments, the electronic system 270 may be represented by the semiconductor device 250, which may contain the control unit 275 as a device internal circuit portion. In this case, the control unit 275 may comprise appropriate circuit elements, such as transistors, resistors and the like, which may be fabricated along with the transistor 200 on the basis of manufacturing strategies as previously discussed with reference to the controllable interconnect structure 260. The control unit 275 may be configured so as to at least provide a specific switching pattern to the interconnect structure 260 in order to obtain a desired overall configuration of the transistor 200. Furthermore, in the illustrative embodiment shown in FIG. 2c, the control unit 275 is connected to the end portions 210S, while, in other embodiments, the control unit 275 may be connected to the transistor terminal 230S. Furthermore, in this case, the unit 275 may be configured to evaluate a functional status of the transistor 200. For example, the unit 275 may comprise a measurement unit 276, which may, in some illustrative embodiments, be configured to determine a resistance and/or a drive current of the transistor 200 and/or of each of the semiconductor fins 210. For this purpose, any appropriate circuit configuration, such as differential amplifier and the like, may be provided in the unit 276 in order to determine the voltage, a current, a resistance or any other indication that may provide information about the functional status of the transistor 200 or of the individual semiconductor fins 210. For example, if connecting each of the end portions 210S with the measurement unit 276, the functional status of each semiconductor fin 210 may be determined without requiring a specific switching pattern in the interconnect structure 260, which may be advantageous when the switches 262 provided therein may have a restricted "live time" or may represent "one time" operable circuit elements, as previously explained when referring to electronic fuses. Consequently, based on the information obtained regarding the functional status of the device 200 and/or the individual semiconductor fins 210, a comparison may be made with respect to a target configuration of the transistor 200 and a corresponding appropriate switching pattern, such as the pattern 263A, may be determined and may be applied to the controllable interconnect structure 260. For example, corresponding comparator units 277 may include a storage element, such as a register, a cache portion and the like, in which a target configuration may be stored, which may then be compared to the currently determined transistor configuration in order to produce a corresponding bridging pattern for actually setting the configuration of the transistor 200. For example, upon detecting a semiconductor fin 210 having a functional status that is outside of a valid range, for instance with respect to resistance, drive current capability, gate leakage current and the like, an appropriate switching pattern may be created by the unit 277 to "replace" the identified semiconductor fin by another one, which is within a valid range.

In other illustrative embodiments, the controllable interconnect structure 260 may comprise the switching elements 262 in the form of transistor elements so that the controllable interconnect structure 260 may readily be used as a multiplexer unit in order to determine the functional status of each of the semiconductor fins 210. In this case, the unit 277 may apply an appropriate switching pattern to the structure 260 in order to select a respective one of the semiconductor fins 210, the electrical behavior of which may then be determined on the basis of the response of the terminal 230S. Thereafter, any further fins 210 may be selected by applying a corresponding switching pattern to the structure 260. In this case, the functional status of the fins 210 may be determined in a serial manner, thereby reducing the number of required interconnect lines for connecting to the measurement unit 276. Upon evaluating the functional status, the unit 277 may then provide a corresponding pattern to the structure 260 so as to set the desired transistor configuration. It should be appreciated that the interconnect structure 260 may be provided in a more sophisticated manner, for instance as is illustrated in FIG. 2b, when an increased flexibility in determining the functional status of the transistor 200 may be required, for instance by detecting static gate leakage currents and the like, while also enabling a complete electrical isolation of a respective semiconductor fin. Furthermore, it should be appreciated that the control unit 275 may also provide appropriate voltages and signals for initiating a specific control regime of the transistor 200. For example, the unit 275 may be connected to the terminal 230S and/or the gate electrode 220 in order to initiate a corresponding measuring condition.

Figure 2D:
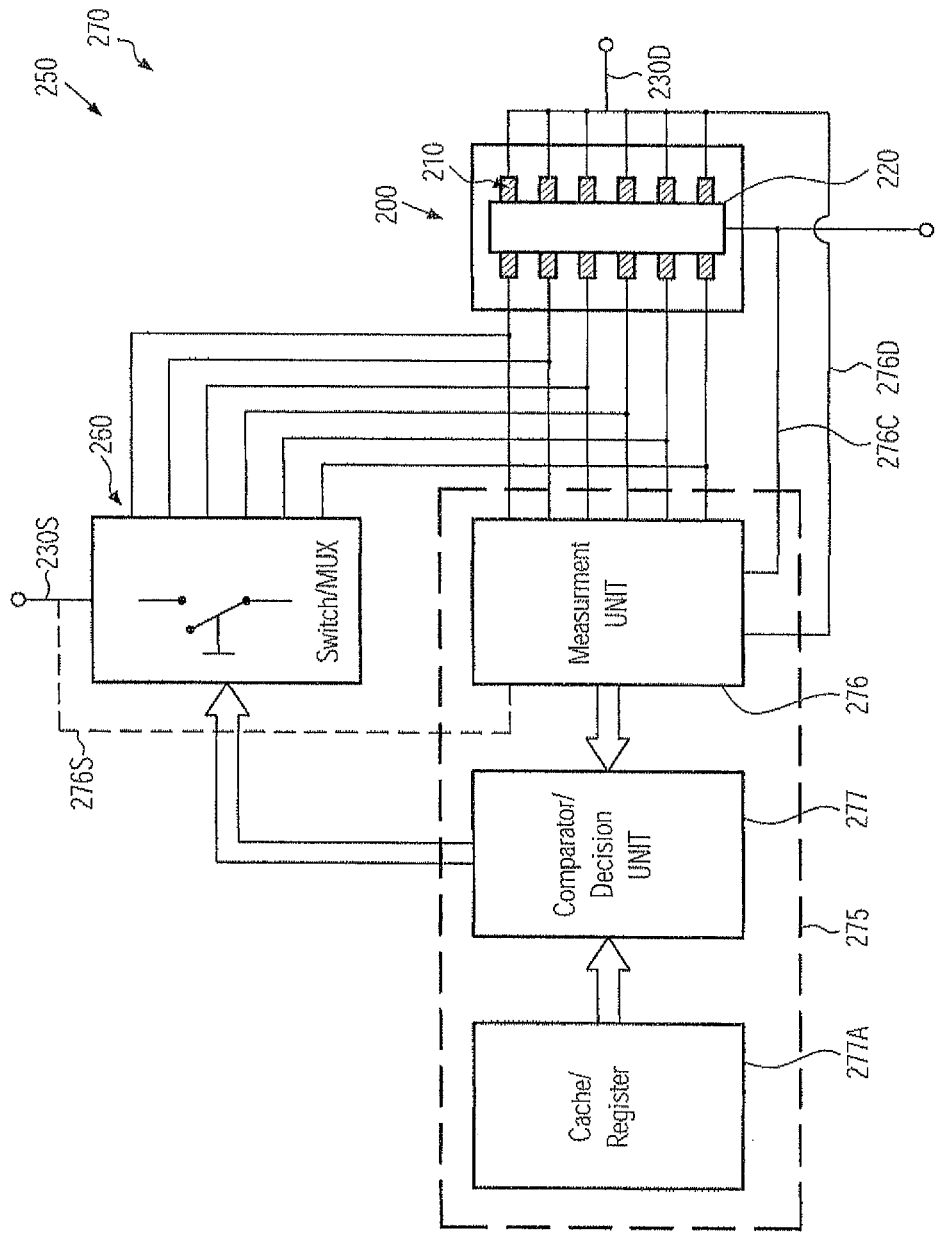
FIG. 2d schematically illustrates an electronic system, which may be incorporated in a semiconductor device, or a portion of which may be provided as an external part of a test platform.

FIG. 2d schematically illustrates the electronic system 270, which may be incorporated in the semiconductor device 250, or a portion of which may be provided as an external part of a test platform, as also described above. Moreover, the system 270 may comprise a control unit 275, wherein the measurement unit 276 may have appropriate connections 276D, 276C so as to connect to the terminal 230D and the gate electrode structure 220, respectively. Furthermore, the fins 210 may be individually connected to the measurement unit 276 or the terminal 230S may be connected to the measurement unit 276, as described above. Consequently, the measurement unit 276 may provide an appropriate "supply" voltage to the terminal 230D, while also providing a corresponding control voltage to the gate electrode structure 220. Hence, the response of each of the fins 210 may be determined, for instance based on a strategy as explained above, in order to obtain an evaluation of the current status of the transistor 200. The measurement result may be supplied to a comparator unit 277, which may thus provide a corresponding "decision" with respect to the switching pattern of the structure 260, wherein the corresponding comparison or decision may be based on information provided by the storage 277A. It should be appreciated that a unit 277 may be configured to provide a corresponding decision on the basis of any implemented algorithms required for determining an appropriate configuration of the transistor 200 on the basis of a measurement result obtained by the unit 276 and any information provided by the storage 277A.

As a result, the present disclosure provides methods and semiconductor devices in which the configuration of complex FINFET elements may be set after completing the manufacturing process by providing at least the plurality of individually accessible semiconductor fins of the transistor, which may be connected to the transistor drain or source terminal on the basis of a desired configuration. In this case, a high degree of flexibility in providing different "flavors" of transistors on the basis of a standard transistor cell may be accomplished, which may thus result in a significantly enhanced production yield for sophisticated semiconductor devices including non-planar transistor architectures. Furthermore, the individual accessibility or connectivity of the semiconductor fins may also provide the possibility of detecting defective portions of the transistor, which may then be replaced by corresponding redundant transistor cells so that an enhanced production yield may also be accomplished. Furthermore, a corresponding evaluation may be performed by device internal functional units, which may thus allow the evaluation of the transistor status at any appropriate stage after manufacturing the semiconductor device and even during certain operational phases, so that enhanced reliability and performance may be accomplished during the entire operational lifetime of the semiconductor device. For example, during certain operating phases, for instance upon initializing and the like, the current functional status of critical transistor elements may be determined and an appropriate configuration may then be elected and set by the device internal components. In this manner, a reduction of drive current capability of the live time may be compensated for by adding additional redundant transistor cells and/or by "replacing" corresponding semiconductor fins, which may no longer be within a valid operating range. In other cases, a corresponding configuration on the basis of the individually accessible semiconductor fins may be performed only once in order to establish different transistor configurations on the basis of the same transistor architecture in accordance with the overall device requirements. In this case, efficient controllable interconnect structures, for instance on the basis of electronic fuses and the like, may be used.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A semiconductor device, comprising:
a plurality of semiconductor fins, each of which comprises at least one end portion individually electrically accessible and a channel portion connecting to said end portion;
a gate electrode structure formed adjacent to said channel portion of each of said plurality of semiconductor fins so as to enable controlling of channel regions provided in said channel portion;
a controllable interconnect structure connecting to a first transistor terminal and to each of said individually electrically accessible end portions, said controllable interconnect structure being configured to individually control connection of each of said end portions to said first transistor terminal;
a control unit connected to said controllable interconnect structure and being configured to control said interconnect structure on the basis of a target configuration of said transistor; and
a second transistor terminal electrically connected to each of said channel portions.

2. The semiconductor device of claim 1, wherein said control unit comprises a storage for storing said target transistor configuration.

3. The semiconductor device of claim 1, wherein said control unit comprises a measurement unit connected to said controllable interconnect structure and configured to determine a functional status of said transistor.

4. The semiconductor device of claim 3, wherein said measurement unit is further configured to determine a functional status of each of said semiconductor fins.

5. The semiconductor device of claim 4, wherein said measurement unit is configured to determine at least one of a drive current, a resistance and a dielectric isolation to said gate electrode structure of each of said semiconductor fins.

6. The semiconductor device of claim 1, further comprising a second controllable interconnect structure connected to a second end portion of each of said plurality of semiconductor fins and to said second transistor terminal.

7. A semiconductor device, comprising:
a plurality of semiconductor fins, each of which comprises a first end portion individually electrically accessible and a channel portion connecting to said first portion;
a gate electrode structure formed adjacent to said channel portion of each of said plurality of semiconductor fins so as to enable controlling of channel regions provided in said channel portion;
a first controllable interconnect structure connecting to a first transistor terminal and to each of said individually electrically accessible first end portions, said controllable interconnect structure being configured to individually control connection of each of said first end portions to said first transistor terminal;
a second transistor terminal electrically connected to each of said channel portions;
a second controllable interconnect structure connected to a second end portion of each of said plurality of semiconductor fins and to said second transistor terminal; and
a control unit connected to said controllable interconnect structure and being configured to control said interconnect structure on the basis of a target configuration of said transistor.

8. The semiconductor device of claim 7, wherein said control unit comprises a storage for storing said target transistor configuration.

9. The semiconductor device of claim 7, wherein said control unit comprises a measurement unit connected to said controllable interconnect structure and configured to determine a functional status of said transistor.

10. The semiconductor device of claim 9, wherein said measurement unit is further configured to determine a functional status of each of said semiconductor fins.

11. The semiconductor device of claim 9, wherein said measurement unit is configured to determine at least one of a drive current, a resistance and a dielectric isolation to said gate electrode structure of each of said semiconductor fins.

12. A semiconductor device, comprising:
a plurality of semiconductor fins, each of which comprises at least one end portion individually electrically accessible and a channel portion connecting to said end portion;
a gate electrode structure formed adjacent to said channel portion of each of said plurality of semiconductor fins so as to enable controlling of channel regions provided in said channel portion;
a controllable interconnect structure connecting to a first transistor terminal and to each of said individually electrically accessible end portions, said controllable interconnect structure being configured to individually control connection of each of said end portions to said first transistor terminal;
a second transistor terminal electrically connected to each of said channel portions; and
a control unit connected to said controllable interconnect structure and being configured to control said interconnect structure on the basis of a target configuration of said transistor, wherein said control unit comprises:
a storage for storing said target transistor configuration; and
a measurement unit connected to said controllable interconnect structure and configured to determine a functional status of said transistor.

13. The semiconductor device of claim 12, wherein said measurement unit is further configured to determine a functional status of each of said semiconductor fins.

14. The semiconductor device of claim 12, wherein said measurement unit is configured to determine at least one of a drive current, a resistance and a dielectric isolation to said gate electrode structure of each of said semiconductor fins.

15. The semiconductor device of claim 14, further comprising a second controllable interconnect structure connected to a second end portion of each of said plurality of semiconductor fins and to said second transistor terminal.

* * * * *